(12) United States Patent
Patterson

(10) Patent No.: US 6,566,926 B1  
(45) Date of Patent: May 20, 2003

(54) HYSTERETIC SELF-BIASED AMPLIFIER

(75) Inventor: James D. Patterson, Colorado Springs, CO (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/179,003

(22) Filed: Jun. 25, 2002

(51) Int. Cl.⁷ .......................... H03K 3/295; H03K 5/153
(52) U.S. Cl. ........................... 327/206; 327/77; 327/67
(58) Field of Search .......................... 327/65, 66, 67, 327/77, 205, 206, 68, 74; 330/253

(56) References Cited

U.S. PATENT DOCUMENTS

| | | | | |
|---|---|---|---|---|
| 4,937,476 A | * | 6/1990 | Bazes | 330/253 |
| 4,958,133 A | * | 9/1990 | Bazes | 330/253 |
| 6,118,318 A | * | 9/2000 | Fifield et al. | 327/206 |
| 6,169,424 B1 | * | 1/2001 | Kurd | 327/66 |
| 6,392,485 B1 | * | 5/2002 | Doi et al. | 330/253 |
| 6,469,579 B2 | * | 10/2002 | Bazes | 330/253 |

* cited by examiner

*Primary Examiner*—Toan Tran
(74) *Attorney, Agent, or Firm*—Schwegman, Lundberg, Woessner & Kluth, P.A.

(57) ABSTRACT

An amplifier and system includes hysteresis circuits.

29 Claims, 5 Drawing Sheets

HYSTERETIC SELF-BIASED AMPLIFIER

BACKGROUND

Self-biased differential amplifiers typically have higher switching speeds and less bias circuitry than conventional (non-self-biased) differential amplifiers.

Self-biased differential amplifiers can be used in applications where they are susceptible to noise. For example, when self-biased differential amplifiers are used in data communications circuits, noise on input nodes of self-biased differential amplifiers can cause data errors.

DESCRIPTION OF EMBODIMENTS

Figure 1:
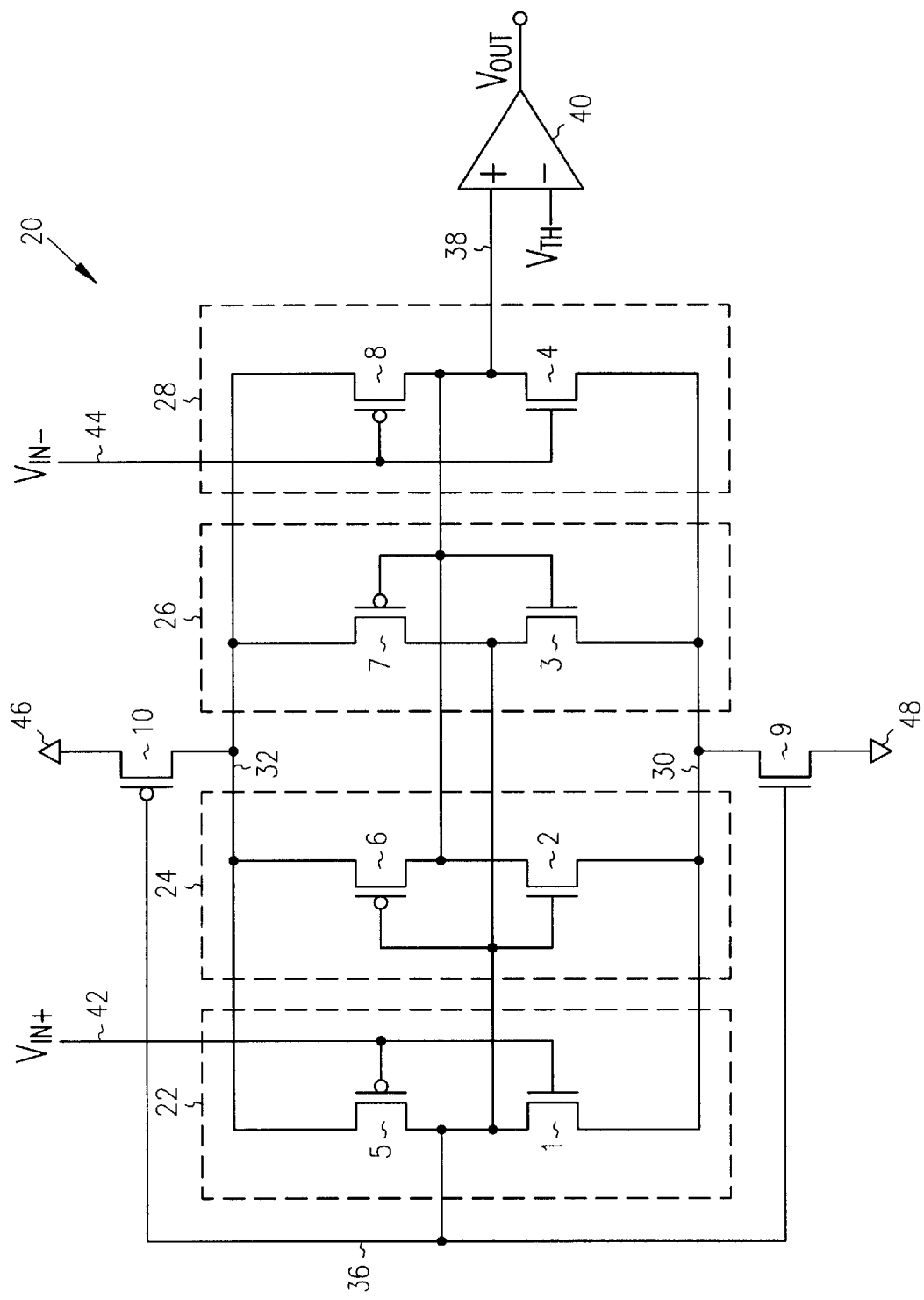
FIG. 1 shows a diagram illustrating a self-biased differential amplifier with hysteresis.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a diagram illustrating a self-biased differential amplifier with hysteresis. Self-biased differential amplifier 20 includes drivers 22 and 28, output sense hysteresis tuning circuit 26, output switch hysteresis circuit 24, tail transistors 9 and 10, and comparator 40. Driver 22 includes transistors 1 and 5; driver 28 includes transistors 4 and 8; output sense hysteresis tuning circuit 26 includes transistors 3 and 7; and output switch hysteresis circuit 24 includes transistors 2 and 6.

The transistors shown in FIG. 1 include n-channel isolated gate field effect transistors and p-channel isolated gate field effect transistors. For example, transistors 5, 6, 7, 8, and 10 are shown as p-channel isolated gate field effect transistors, and transistors 1, 2, 3, 4, and 9 are shown as n-channel isolated gate field effect transistors. In some embodiments, the n-channel isolated gate field effect transistors are n-channel metal oxide semiconductor field effect transistors (NMOSFETs) and the p-channel isolated gate field effect transistors are p-channel metal oxide semiconductor field effect transistors (PMOSFETs). The choice of NMOSFETs and PMOSFETs for use in the figures is strictly one of convenience. The various methods and apparatus of the present invention can be practiced with other types of components such as gallium arsenide (GaAs) transistors and bipolar junction transistors. A great number of suitable component types exist to practice the various embodiments of the invention, and a choice of any of these component types can be made without departing from the scope of the present invention. The gate nodes of the transistors are sometimes referred to as "control nodes." The control nodes can correspond to any node of a component that can influence the operation of the component. For example, in embodiments that utilize bipolar junction transistors, the control node may correspond to the base terminal of the transistor.

Driver 22 receives input signal Vin+ on the control nodes of transistors 1 and 5; and driver 28 receives input signal Vin− on the control nodes of transistors 4 and 8. A first differential pair of input transistors is formed by transistors 5 and 8, and a second differential pair of input transistors is formed by transistors 1 and 4. Differential output nodes 36 and 38 are formed at the outputs of drivers 22 and 28. Output node 36 forms a self-bias node that is coupled to control nodes of tail transistors 9 and 10. In some embodiments, comparator 40 is included at the output of the self-biased differential amplifier to sharpen the output transitions when operating at common mode input voltages close to the power supply rails, but this is not required. In embodiments represented by FIG. 1, comparator 40 compares the voltage on node 38 to a threshold voltage (Vth), and generates the output voltage (Vout).

Tail transistor 10 is coupled source-to-drain, or in "series," between upper voltage supply node 46 and common node 32. Likewise, tail transistor 9 is coupled in series between common node 30 and lower voltage supply node 48. Upper voltage supply node 46 may also be referred to as the "upper voltage supply," the "positive voltage supply," or the "upper rail." Each of these terms is meant to indicate a single circuit node or the voltage present on that single circuit node. Similarly, lower voltage supply node 48 may also be referred to as the "lower voltage supply," the "negative voltage supply," or the "lower rail." Each of these terms are also meant to indicate a single circuit node or the voltage present on that node. There is no requirement that the voltage present on node 46 be positive with reference to ground. There is also no requirement that the voltage present on node 48 be negative with reference to ground. In some embodiments, voltages on both upper voltage supply node 46 and lower voltage supply node 48 are positive, and in some embodiments, both are negative.

Output sense hysteresis tuning circuit 26 and output switch hysteresis circuit 24 provide hysteresis to self-biased differential amplifier 20. As discussed more fully below, the hysteresis of the amplifier can be measured by setting the voltage on one input node to a substantially constant value and "sweeping" the voltage on the other input node. For example, Vin− on node 44 may be held constant while Vin+ is swept up or down in voltage. Alternatively, Vin+ may be held constant while Vin− is swept up or down. The circuit shown in FIG. 2 is now described to illustrate the operation of the feedback circuits that provide the hysteresis to self-biased differential amplifier 20 (FIG. 1).

Figure 2:
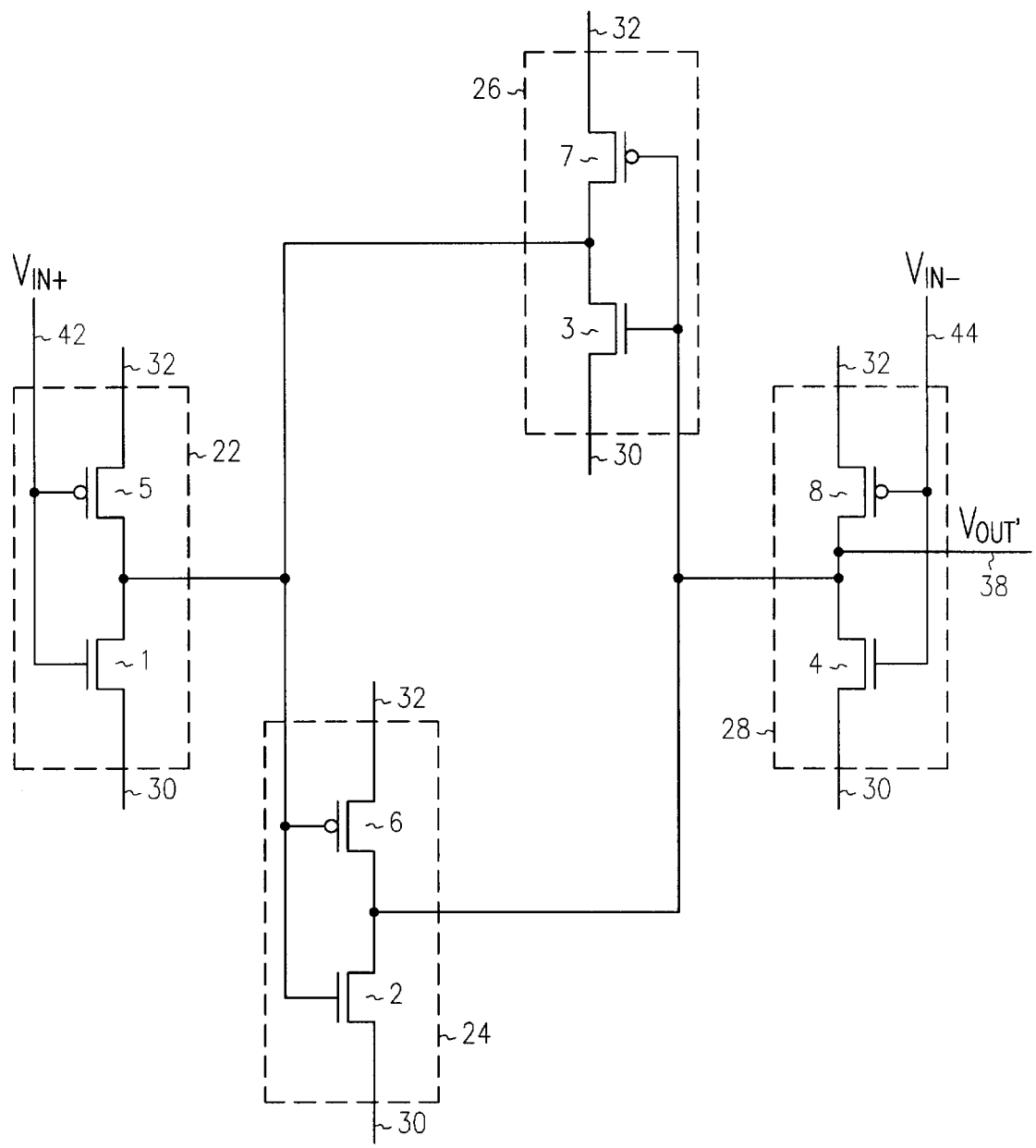
FIG. 2 shows a diagram illustrating a simplified self-biased differential amplifier with hysteresis.

FIG. 2 shows a diagram illustrating a simplified self-biased differential amplifier with hysteresis. Transistors 3 and 7 make up output sense hysteresis tuning circuit 26 which drives the input node of output switch hysteresis circuit 24, and also drives the output node of driver 22. In some embodiments, output switch hysteresis circuit 24 is a complementary metal oxide semiconductor (CMOS) inverter composed of transistors 2 and 6, which is "tuned" to trip at substantially mid-rail.

Consider the output transition of Vout' from a low-to-high. This occurs when Vin+ is rising above Vin− by a differential voltage $\Delta V_{UTP}$, the value of which is determined by the hysteresis designed into the circuit. An approximate solution is obtained by assuming an output of mid-rail indicates that the switching event has occurred. In order for the output voltage Vout' to rise to mid-rail, the inverter composed of transistors 2 and 6 switches from low-to-high. In some embodiments, the threshold voltage for transistors 2 and 6 is tuned to mid-rail. To determine the differential voltage $\Delta V_{UTP}$ across the Vin+ and Vin− inputs that will switch the inverter, the sub-circuit forming an equivalent inverter from transistors 1, 5, and 7 is considered. In embodiments represented by FIG. 2, transistors 5 and 7 are parallel devices which push the threshold of the equivalent inverter toward a higher value than an inverter having transistors 1 and 5 alone. In the equations that follow, the voltage on node 32 is referred to as Vcc, and the voltage on node 30 is assumed to be ground. This simplifies the equations. One skilled in the art will understand that in embodiments having voltage values other than ground on node 30, the equations include additional terms. $\Delta V_{UTP}$ is given by:

$$\frac{\Delta V_{UTP}}{2} = \frac{\beta_R(Vcc + Vtp5) - Vtn1 - [(\beta_R(Vcc + Vtp5 - Vtn1))^2 - \alpha_{UTP}(\beta_R - 1)]^{1/2}}{\beta_R - 1} - Vth0$$

$$\beta_R = \frac{\beta_5}{\beta_1}$$

$$\alpha = \frac{2I_7}{\beta_1}$$

$$I_7 = \frac{\beta_7}{2}\left(Vcc' - \frac{Vcc}{2} + Vtp7\right)^2$$

$$Vth0 = \frac{Vtn1 + \sqrt{\beta_R}\,(Vcc + Vtp5)}{1 + \sqrt{\beta_R}}$$

where numerical subscripts correspond to the numbered transistors. Once the sizes of transistors 1 and 5 have been determined, the size of transistor 7 determines the upper threshold point (UTP). For example, an increase in the size of transistor 7 results in a higher threshold point for the forward sweep.

Similarly, the lower threshold point (LTP) is determined by the equivalent inverter that includes transistors 1, 5, and 3, and is given by:

$$\frac{\Delta V_{LTP}}{2} = \frac{\beta_R(Vcc + Vtp5) - Vtn1 - [(\beta_R(Vcc + Vtp5 - Vtn1))^2 + \alpha_{LTP}(\beta_R - 1)]^{1/2}}{\beta_R - 1} - Vth0$$

$$\beta_R = \frac{\beta_5}{\beta_1}$$

$$\alpha = \frac{2I_3}{\beta_1}$$

$$I_3 = \frac{\beta_3}{2}\left(\frac{Vcc}{2} - Vtn3 - Vss'\right)^2$$

-continued $$Vth0 = \frac{Vtn1 + \sqrt{\beta_R}\,(Vcc + Vtp5)}{1 + \sqrt{\beta_R}}$$

Similar to the UTP, once the sizes of transistors 1 and 5 have been determined, the size of transistor 3 determines the lower threshold LTP. An increase in the size of transistor 3 results in a lower threshold point for the reverse sweep.

The total hysteresis is given by:

$$\Delta V_{UTP} - \Delta V_{LTP}$$

Simulations have been performed to investigate the effect of the sizes of transistors 3 and 7 on the hysteresis of self-biased differential amplifier 20 (FIG. 1). The output voltage of self-biased differential amplifier 20 was recorded as Vin+ was swept in the forward and reverse directions with Vin− tied to a voltage at substantially the midpoint between the upper and lower rails, and the voltage on the upper rail was set to approximately 3.3 volts, and the lower rail was set to ground. In a first simulation where both transistors 3 and 7 were tuned to have equal current drive capability, the lower threshold point was measured at 1.522 volts and the upper threshold point was measured at 1.732 volts. In a second simulation, the size of transistor 7 was increased while the size of transistor 3 remained the same as in the first simulation. The UTP increased to 1.773 volts while the LTP remained the same (1.522 volts). In a third simulation, the size of transistor 3 was increased while the size of transistor 7 remained the same as the first simulation. The LTP decreased to 1.444 volts while the UTP remain the same (1.732 volts).

Figure 3:
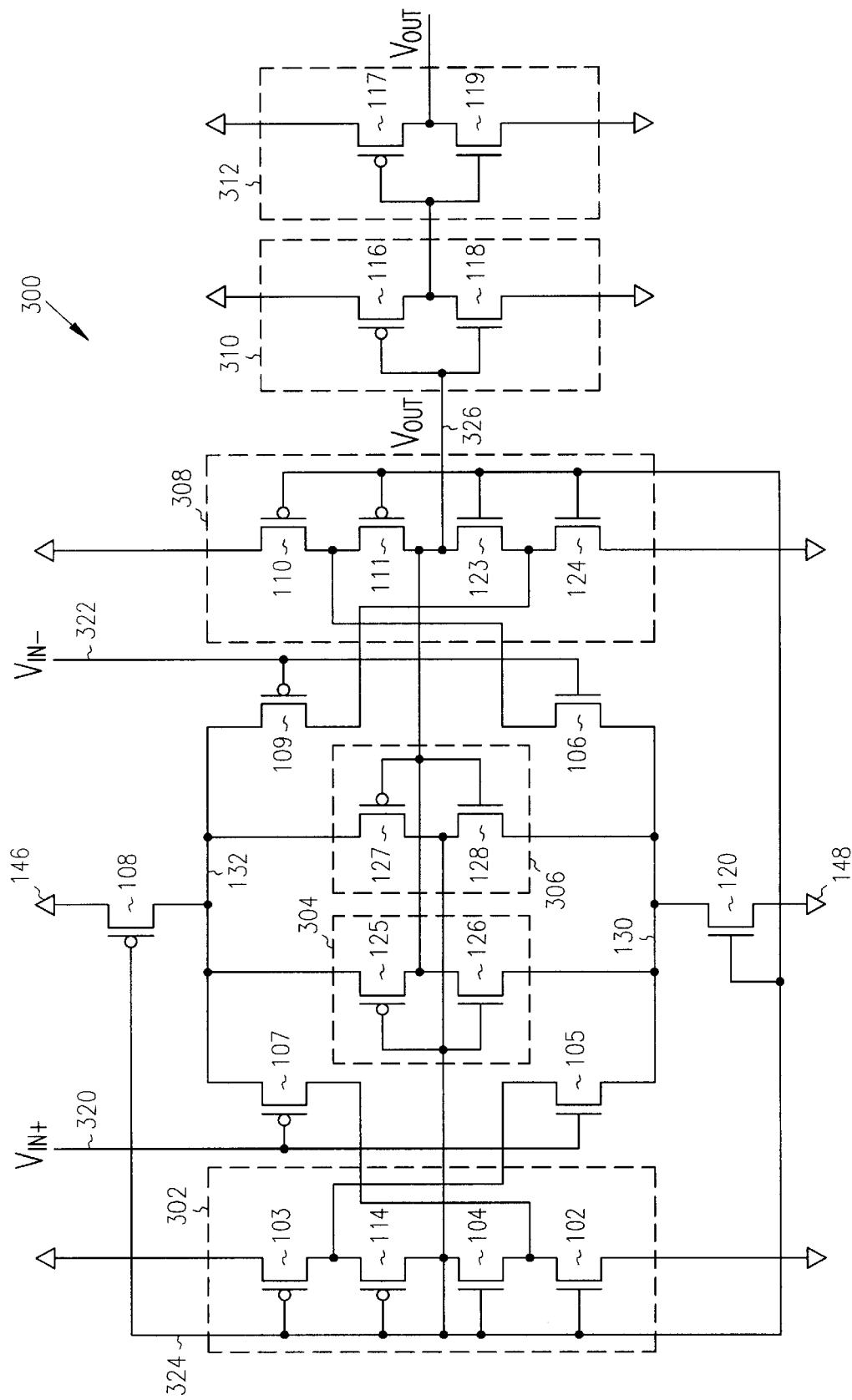
FIG. 3 shows a diagram illustrating another self-biased differential amplifier with hysteresis.

FIG. 3 shows a diagram illustrating another self-biased differential amplifier with hysteresis. Self-biased differential amplifier 300 includes tail transistors 108 and 120, input transistors 107, 109, 105, and 106, output sense hysteresis tuning circuit 306, output switch hysteresis circuit 304, cascode output stages 302 and 308, and inverters 310 and 312.

Tail transistor 108 is coupled in series between upper voltage supply node 146 and common node 132, and tail transistor 120 is coupled in series between lower voltage supply node 148 and common node 130.

Transistors 107 and 109 form a first differential pair of input transistors having control nodes coupled to differential input nodes 320 and 322, and transistors 105 and 106 form a second differential pair of input transistors having control nodes coupled to differential input nodes 320 and 322. The first differential pair of input transistors are coupled in series between tail transistor 108 and cascode output stages 302 and 308. Likewise, the second differential pair of input transistors are coupled in series between tail transistor 120 and cascode output stages 302 and 308.

Cascode output stage 302 produces a self-bias voltage on output node 324, and cascode output stage 308 produces output voltage Vout' on output node 326. Output nodes 324 and 326 are differential output nodes. Output node 326 is input to inverter 310, which in combination with inverter 312, sharpens output signal transitions. In some embodiments, inverters 310 and 312 are omitted. In other embodiments, a comparator, such as comparator 40 (FIG. 1) is used in place of inverters 310 and 312.

Hysteresis is provided through negative feedback by output sense hysteresis tuning circuit 306. This circuit senses the output state on node 326, inverts and feeds it back to the inverting output on node 324. Node 324 in turn drives output switch hysteresis circuit 304. Output switch hysteresis circuit 304 holds the output signal on output node 326 at its past state until the differential input voltage (Vin+−Vin−) is sufficiently high to move output node 324 through the threshold of output switch hysteresis circuit 304 which releases output node 326 and allows it to change state.

Consider the output transition of Vout' on node 326 from a low-to-high. This occurs when Vin+ is rising above Vin− by a differential voltage $\Delta V_{UTP}$, the value of which is determined by the hysteresis designed into the circuit. An approximate solution is obtained by assuming an output of mid-rail indicates that the switching event has occurred. In order for the output voltage to rise to substantially mid-rail, the inverter composed of transistors 125 and 126 first switches from low-to-high. In some embodiments, the threshold voltage for transistors 125 and 126 is tuned to be substantially mid-rail. To determine the differential voltage $\Delta V_{UTP}$ across the Vin+ and Vin− inputs that will switch this inverter, the sub-circuit including transistors 103, 114, 104, 102, 108, 107, 105, and 120 is considered. Summing currents at the source of transistor 102:

$$I_{102} = I_{103} - I_{105} + I_{127} + I_{107}$$

The current through transistor 128 can be excluded from the equation above since the bias on its gate is low when Vout' is low.

$I_{107}$ and $I_{105}$ can be rewritten as the sum of the direct current (DC) bias current and the current due to the differential voltage:

$$I_{107} = I_{108DC}/2 - gm_{107}(vin_+ - vin_-)$$

$$I_{105} = I_{120DC}/2 + gm_{105}(vin_+ - vin_-)$$

In some embodiments, the complementary transistors have their sizes scaled to match their current driving strengths resulting in:

$$I_{108DC} = I_{120DC}$$

$$I_{102} = I_{103}$$

Using these relations, the upper threshold point $\Delta V_{UTP}$ is given by:

$$\Delta V_{UTP} = \frac{(k_{127}(vcc/2 + vtp_{127}))^2}{gm_{105} + gm_{107}}$$

where:

$k_{127}$=transconductance factor of transistor 127

$$k_{127} = \mu_p C_{ox}(W/l)$$

$\mu_p$=mobility of PMOSFET device $C_{OX}$=gate oxide capacitance w/l=width/length ratio of transistor 127 vcc=upper supply voltage lower supply voltage=0

$vtp_{127}$=threshold voltage of transistor 127

$gm_{107}$=transconductance of transistor 107

$gm_{108}$=transconductance of transistor 105

As shown above, the upper threshold point (UTP) is determined in part by the size of transistor 127. An increase in the size of transistor 127 results in an increased UTP during a forward sweep of the input differential voltage.

Similarly, the lower threshold point (LTP) is given by:

$$\Delta V_{LTP} = -\frac{(k_{128}(vcc/2 - vtn_{128}))^2}{gm_{105} + gm_{107}}$$

Similar to the UTP, once the sizes of the various transistors have been determined, the size of transistor 128 determines the lower threshold point. An increase in the size of transistor 128 results in a lower threshold point for the reverse sweep.

Simulations have been performed to investigate the effect of the sizes of transistors 127 and 128 on the hysteresis of self-biased differential amplifier 300 (FIG. 3). The output voltage of self-biased differential amplifier 300 was recorded as Vin+ was swept in the forward and reverse directions with Vin− tied to Vcc/2, where Vcc was set to approximately 3 volts.

In a first simulation where both transistors 127 and 128 were tuned to have equal current drive capability, the lower threshold point was measured at 1.4 volts and the upper threshold point was measured at 1.6 volts. In a second simulation, the size of transistor 127 was increased while the size of transistor 128 remained the same as in the first simulation. The UTP increased to 1.64 volts, while the LTP remained the same (1.4 volts). In a third simulation, the size of transistor 128 was increased while the size of transistor 127 remained the same as in the first simulation. The LTP decreased to 1.372 volts while the UTP remained the same (1.6 volts).

Simulations similar to those just described were performed to measure the effect of different common mode input voltages on the hysteresis characteristic of the amplifier. The hysteresis characteristic was found to be substantially symmetric about the mid-rail common mode input voltage with increasing hysteresis as the common mode input voltage approached either the lower rail or the upper rail.

Three simulations were performed with Vin− set to 0.8 volts, 1.5 volts, and 2.5 volts respectively. In each of the three simulations, The upper rail was set to 3 volts, the lower rail was set to ground, Vin+ was swept in the forward and reverse directions, and the output response was measured. As described above, the nominal case where transistors 127 and 128 are tuned to have equal current drive capability yields hysteresis at mid-rail (approximately 1.5 volts) of substantially 0.2 volts. The characteristic at common mode input voltages of 0.8 volts and 2.5 volts showed an increase in hysteresis as the common mode input voltage approaches either the lower or upper rail.

Figure 4:
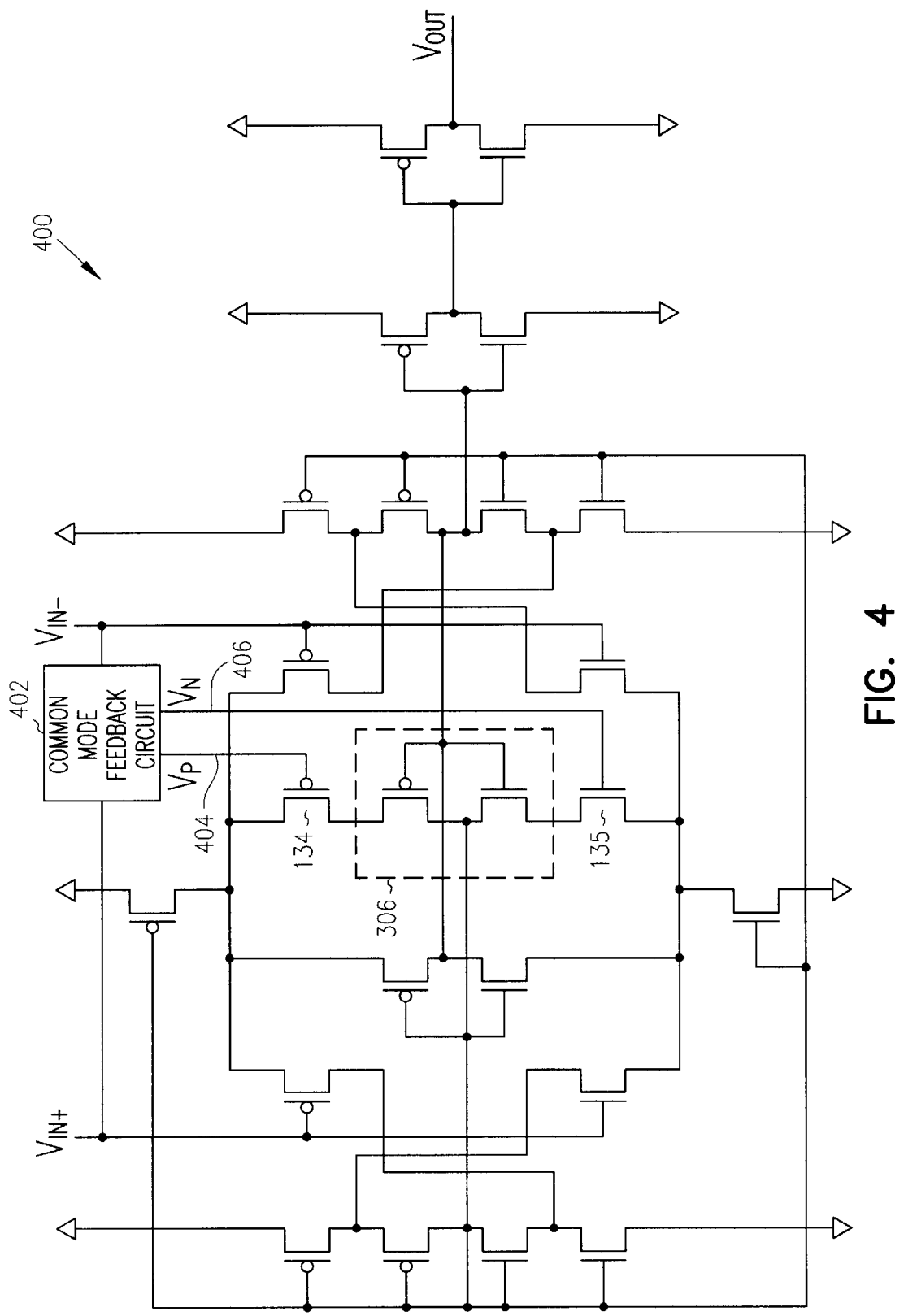
FIG. 4 shows a diagram illustrating a self-biased differential amplifier with common mode feedback.

FIG. 4 shows a diagram illustrating a self-biased differential amplifier with common mode feedback. The common mode feedback provided in self-biased differential amplifier 400 reduces the variation in hysteresis as a function of common mode input voltage. Self-biased differential amplifier 400 includes the circuitry of self-biased differential amplifier 300 (FIG. 3), and also includes common mode feedback circuit 402 and compensation transistors 134 and 135 in series with output sense hysteresis tuning circuit 306. Common mode feedback circuit 402 drives the gate nodes of compensation transistors 134 and 135. To flatten the hysteresis characteristic, common mode feedback circuit 402 provides gate voltages to transistors 134 and 135 that increase their resistance as the common mode input voltage moves from mid-rail toward either supply rail. The common mode feedback circuit is shown in FIG. 5.

Figure 5:
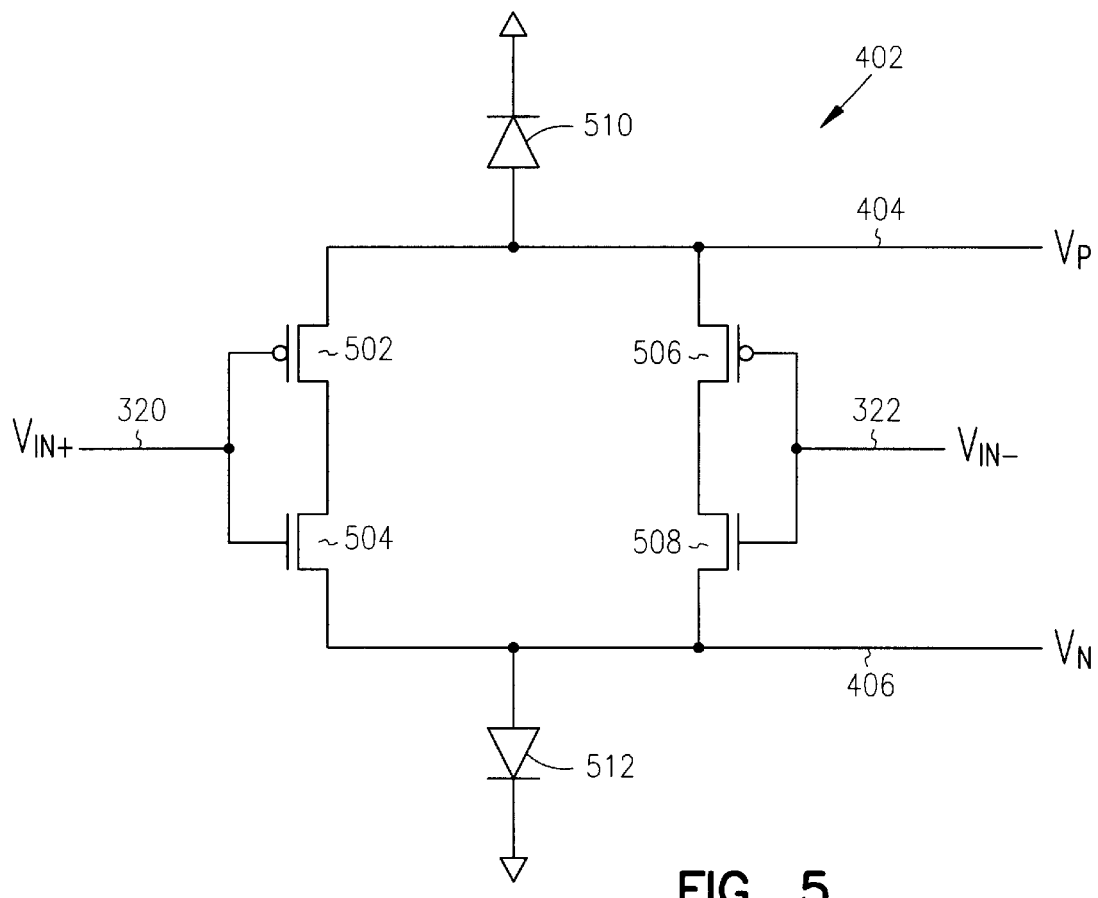
FIG. 5 shows a diagram illustrating a common mode feedback circuit.

FIG. 5 shows a diagram illustrating a common mode feedback circuit. Common mode feedback circuit 402 includes Transistors 502, 506, 504, and 508, and diodes 510 and 512. Transistors 502 and 504 form a first complementary input pair and transistors 506 and 508 form a second complementary input pair. Both the first and second complementary input pairs are connected in series between diodes 510 and 512. Diodes 510 and 512 can be implemented in a variety of different ways, including as a standard physical diode or a diode connected MOSFET. Common mode feedback circuit 402 provides signal Vp on node 404 to drive the control node of compensation transistor 134, and also provides signal Vn on node 406 to drive the control node of compensation transistor 135.

The voltage value of the Vp signal on node 404 increases as the common mode input voltage moves toward either supply rail from mid-rail. This results in a higher effective source-to-drain resistance of transistor 134 at common mode input voltages near the supply rails. Consequently, the UTP is reduced or compensated downward at the rails relative to the use of transistor 127 alone. Similarly, the value of the Vn signal on node 406 decreases as the common mode input voltage moves toward either supply rail from mid-rail. This produces a voltage on the gate of transistor 135 that results in higher resistance near the rails. Consequently, the LTP is increased or compensated upward at the rails relative to the use of transistor 128 alone.

Figure 6:
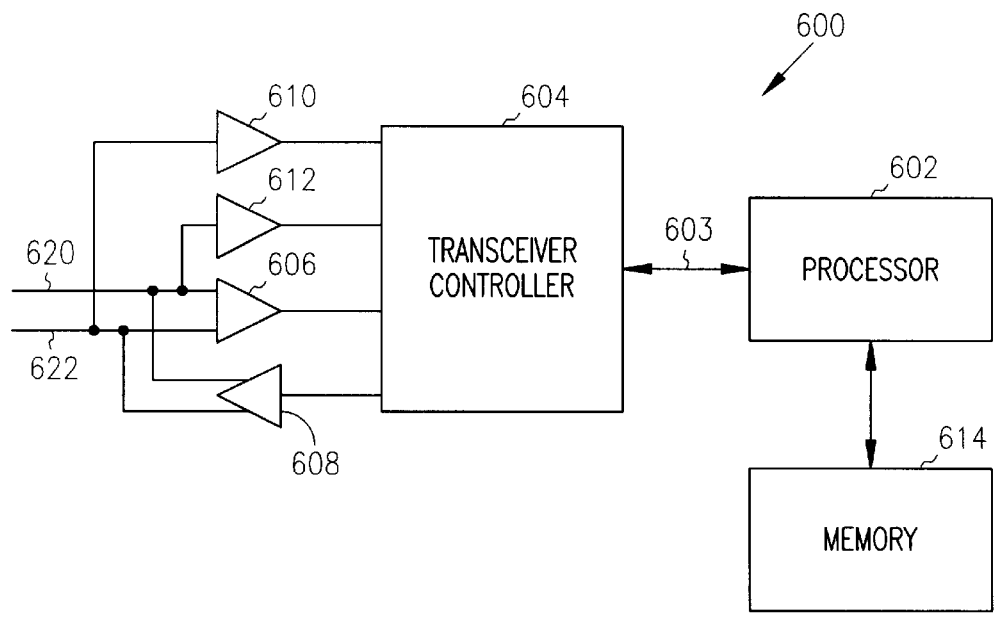
FIG. 6 shows a diagram of a system.

FIG. 6 shows a diagram of a system. System 600 includes receivers 610 and 612, differential receiver 606, driver 608, processor 602, memory 614, and transceiver controller 604. Differential receiver 606 includes a hysteretic self-biased differential amplifier, such as self-biased differential amplifiers 20 (FIG. 1), 300 (FIG. 3), or 400 (FIG. 4). Differential receiver 606 detects the differential voltage present on nodes 620 and 622. Receivers 610 and 612 are single-ended receivers that detect the voltage values present on nodes 620 and 622.

Transceiver controller 604 communicates with other devices on nodes 620 and 622 by transmitting data using driver 608 and receiving data using differential receiver 606. Transceiver controller 604 also receives data using single-ended receivers 610 and 612. Transceiver controller 604 also communicates with processor 602 on node 603.

Transceiver controller 604 can be any type of transceiver controller suitable to communicate with the transceiver formed by differential receiver 606 and differential transmitter 608. For example, transceiver controller may be a universal serial bus (USB) controller, a synchronous optical network (SONET) controller, a Firewire controller, or the like.

In some embodiments, single-ended receivers 610 and 612 are used simultaneously with differential receiver 606 and transmitter 608. In other embodiments, they are not used simultaneously. For example, in some USB embodiments, situations exist where single-ended receivers 610 and 612 are used separately from differential receiver 606 to detect wake-up events.

Processor 602 may be any type of processor suitable to perform actions to support the operation of system 600. For example, processor 602 may be a microprocessor, a microcontroller, or the like. Also for example, processor 602 may be a hardware controller or a collection of hardware controllers that perform specific tasks. Memory 614 represents an article that includes a machine-accessible medium. For example, memory 614 may represent any one or more of the following: a hard disk, a floppy disk, random access memory (RAM), read only memory (ROM), flash memory, CDROM, or any other type of article that includes a medium readable by a machine. Memory 614 may store instructions for performing the execution of the various method embodiments of the present invention.

Systems represented by the various foregoing figures can be of any type. Examples of represented systems include computers (e.g., desktops, laptops, handhelds, servers, Web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A circuit comprising:
    a first differential pair of input transistors coupled between a pair of output nodes and a first common node, the first differential pair of input transistors having control nodes coupled between a pair of input nodes;
    a second differential pair of input transistors coupled between the pair of output nodes and a second common node, the second differential pair of input transistors having control nodes coupled between the pair of input nodes;
    a first tail transistor coupled between the first common node and an upper voltage supply node;
    a second tail transistor coupled between the second common node and a lower voltage supply node, wherein the first and second tail transistors are configured to be biased by one of the pair of output nodes;
    an output sense hysteresis tuning circuit coupled between the pair of output nodes; and
    an output switch hysteresis circuit coupled between the pair of output nodes.

2. The circuit of claim 1 wherein the output sense hysteresis tuning circuit comprises a first pair of complementary transistors coupled in series between the first common node and the second common node, the first pair of complementary transistors having control nodes coupled to a first output node of the pair of the output nodes, and having a node formed at a junction between the first pair of complementary transistors coupled to a second output node of the pair of output nodes.

3. The circuit of claim 2 wherein the output switch hysteresis circuit comprises a second pair of complementary transistors coupled in series between the first common node and the second common node, the second pair of complementary transistors having control nodes coupled to the second output node, and having a node formed at a junction between the second pair of complementary transistors coupled to the first output node.

4. The circuit of claim 3 wherein the first pair of complementary transistors are sized to provide hysteresis between the pair of input nodes and the pair of output nodes.

5. A self-biased amplifier circuit comprising:
    a first tail transistor coupled to be biased by a first amplifier output node, the first tail transistor coupled to an upper voltage supply node;

a second tail transistor coupled to be biased by the first amplifier output node, the second tail transistor coupled to a lower voltage supply node;

an output sense hysteresis tuning circuit coupled between the first and second tail transistors, the output sense hysteresis tuning circuit configured to drive the first amplifier output node in response to a second amplifier output node; and an output switch hysteresis circuit coupled between the first and second tail transistors, the output switch hysteresis circuit configured to drive the second amplifier output node in response to the first amplifier output node.

6. The self-biased amplifier circuit of claim 5 further comprising:

a first differential pair of input transistors having a common node coupled to the first tail transistor; and a second differential pair of input transistors having a common node coupled to the second tail transistor.

7. The self-biased amplifier circuit of claim 6 wherein the first and second differential pairs of input transistors are coupled to form the first and second amplifier output nodes.

8. The self-biased amplifier circuit of claim 6 further comprising first and second cascode output stages coupled to the first and second differential pairs of input transistors.

9. The self-biased amplifier circuit of claim 6 further comprising a first feedback transistor coupled in series between the first tail transistor and the output sense hysteresis tuning circuit.

10. The self-biased amplifier circuit of claim 9 further comprising a common mode feedback circuit including a diode coupled between the upper voltage supply node and a control node of the first feedback transistor.

11. The self-biased amplifier circuit of claim 10 wherein the feedback circuit further includes:

a second diode coupled to the lower supply voltage node;

a first pair of complementary transistors coupled in series between the first and second diodes, the first pair of complementary transistors having control nodes coupled in common with an input node of the self-biased amplifier circuit; and a second pair of complementary transistors coupled in series between the first and second diodes, the second pair of complementary transistors having control nodes coupled in common with a second input node of the self-biased amplifier circuit.

12. The self-biased amplifier circuit of claim 11 further comprising a second feedback transistor coupled in series between the second tail transistor and the output sense hysteresis tuning circuit, the second feedback transistor having a control node coupled to the second diode.

13. An apparatus comprising:

first and second tail transistors;

a hysteresis circuit;

a first feedback transistor coupled between the first tail transistor and the hysteresis circuit;

a second feedback transistor coupled between the second tail transistor and the hysteresis circuit; and a feedback circuit to couple a control node of the first feedback transistor to an upper voltage supply node through a first diode, and to couple a control node of the second feedback transistor to a lower voltage supply node through a second diode.

14. The apparatus of claim 13 further comprising:

a first differential pair of input transistors coupled to the first tail transistor, the first differential pair of input transistors having control nodes coupled to a pair of differential input nodes.

15. The apparatus of claim 14 wherein the feedback circuit comprises:

a first pair of complementary transistors coupled in series between the first and second diodes, wherein control nodes of the first pair of complementary transistors are coupled to a first of the pair of differential input nodes.

16. The apparatus of claim 15 wherein the feedback circuit further comprises:

a second pair of complementary transistors coupled in series between the first and second diodes, wherein control nodes of the second pair of complementary transistors are coupled to a second of the pair of differential input nodes.

17. The apparatus of claim 13 wherein the hysteresis circuit comprises a first complementary pair of transistors coupled in series between the first and second feedback transistors.

18. The apparatus of claim 17 further comprising a second hysteresis circuit including a second complementary pair of transistors coupled in series between the first and second tail transistors.

19. The apparatus of claim 13 further comprising:

a first differential pair of input transistors coupled to the first tail transistor, the first differential pair of input transistors having control nodes coupled to a pair of differential input nodes;

a second differential pair of input transistors coupled to the second tail transistor, the second differential pair of input transistors having control nodes coupled to the pair of differential input nodes; and a first cascode output stage and a second cascode output stage coupled to the first and second differential pairs of input transistors.

20. The apparatus of claim 19 wherein the first cascode output stage is configured to provide a self-bias node coupled to the first and second tail transistors.

21. The apparatus of claim 20 wherein the feedback circuit comprises:

a first pair of complementary transistors coupled in series between the first and second diodes, wherein control nodes of the first pair of complementary transistors are coupled to a first of the pair of differential input nodes.

22. The apparatus of claim 21 wherein the feedback circuit further comprises:

a second pair of complementary transistors coupled in series between the first and second diodes, wherein control nodes of the second pair of complementary transistors are coupled to a second of the pair of differential input nodes.

23. A system comprising:

a first tail transistor coupled to be biased by a first amplifier output node, the first tail transistor coupled to an upper voltage supply node;

a second tail transistor coupled to be biased by the first amplifier output node, the second tail transistor coupled to a lower voltage supply node;

an output sense hysteresis tuning circuit coupled between the first and second tail transistors, the output sense hysteresis tuning configured to drive the first amplifier output node in response to a second amplifier output node;

an output switch hysteresis circuit coupled between the first and second tail transistors, the output switch hysteresis circuit configured to drive the second amplifier output node in response to the first amplifier output node; and a universal serial bus controller coupled to the second amplifier output node.

24. The system of claim 23 further comprising:

a first differential pair of input transistors having a common node coupled to the first tail transistor; and a second differential pair of input transistors having a common node coupled to the second tail transistor.

25. The system of claim 24 wherein the first and second differential pairs of input transistors are coupled to form the first and second amplifier output nodes.

26. The system of claim 24 further comprising first and second cascode output stages coupled to the first and second differential pairs of input transistors.

27. The system of claim 24 further comprising a first feedback transistor coupled in series between the first tail transistor and the output sense hysteresis tuning circuit.

28. The system of claim 27 further comprising a common mode feedback circuit including a diode coupled between the upper voltage supply node and a control node of the first feedback transistor.

29. The system of claim 28 wherein the feedback circuit further includes:

a second diode coupled to the lower supply voltage node;

a first pair of complementary transistors coupled in series between the first and second diodes, the first pair of complementary transistors having control nodes coupled in common with an input node of the self-biased amplifier circuit; and a second pair of complementary transistors coupled in series between the first and second diodes, the second pair of complementary transistors having control nodes coupled in common with a second input node of the self-biased amplifier circuit.

* * * * *